United States Patent
Senthilkumar et al.

(10) Patent No.: US 7,109,810 B2
(45) Date of Patent: Sep. 19, 2006

(54) OSCILLATOR WITH TUNABLE CAPACITOR

(75) Inventors: Chinnugounder Senthilkumar, Folsom, CA (US); Robert Fulton, Folsom, CA (US); Tea Lee, Sacramento-Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/695,263

(22) Filed: Oct. 27, 2003

(65) Prior Publication Data

US 2004/0085142 A1 May 6, 2004

Related U.S. Application Data

(62) Division of application No. 10/054,358, filed on Jan. 17, 2002.

(51) Int. Cl.
*H03B 5/36* (2006.01)

(52) U.S. Cl. .................. 331/116 R; 331/158; 331/179; 368/46; 368/47; 73/1.43

(58) Field of Classification Search .................. 368/46, 368/47; 73/1.43; 331/116 R, 158, 179
See application file for complete search history.

(56) References Cited

U.S. PATENT DOCUMENTS

| | | | | |
|---|---|---|---|---|
| 3,930,169 A | * | 12/1975 | Kuhn, Jr. | 377/107 |
| 4,582,434 A | * | 4/1986 | Plangger | 368/46 |
| 4,851,792 A | * | 7/1989 | Ochiai et al. | 331/158 |
| 4,977,380 A | | 12/1990 | Martin et al. | |
| 5,323,066 A | | 6/1994 | Feddeler et al. | |
| 5,391,999 A | | 2/1995 | Early et al. | |
| 5,546,055 A | * | 8/1996 | Klughart | 331/116 FE |
| 5,801,411 A | * | 9/1998 | Klughart | 257/296 |
| 5,805,029 A | * | 9/1998 | Theus et al. | 331/116 FE |
| 5,914,513 A | | 6/1999 | Shenai et al. | |
| 5,977,839 A | * | 11/1999 | Tsumura | 331/36 C |
| 6,094,105 A | * | 7/2000 | Williamson | 331/116 FE |
| 6,181,184 B1 | | 1/2001 | Yamazaki et al. | |
| 6,292,065 B1 | | 9/2001 | Friedman et al. | |
| 6,337,604 B1 | * | 1/2002 | Clarke | 331/116 R |
| 6,400,231 B1 | * | 6/2002 | Leduc et al. | 331/116 FE |
| 6,650,194 B1 | | 11/2003 | Kertis et al. | |
| 6,734,483 B1 | | 5/2004 | Morand et al. | |
| 6,804,775 B1 | * | 10/2004 | Park | 713/2 |
| 2001/0050598 A1 | | 12/2001 | Mourant et al. | |

FOREIGN PATENT DOCUMENTS

| | | | |
|---|---|---|---|
| EP | 1134921 A2 | * | 9/2001 |
| JP | 62-23228 | | 1/1987 |
| JP | 11901106 | * | 7/1989 |

OTHER PUBLICATIONS

Webster's Ninth New Collegiate Dictionary 1991 p. 794.*
Horn "Basic Electronics Theory" 4th Edition TAB books 1994 pp. 377-378 and pp. 454-465.*
Horn "Basic Electronics Theory" 4th Edition TAB Books 1994 pp. 418-426 and 377 and 378.*

(Continued)

*Primary Examiner*—Michael B Shingleton
(74) *Attorney, Agent, or Firm*—Philip A. Pedigo

(57) ABSTRACT

Circuitry for controlling the oscillation frequency of an oscillator by using a digitally tunable on-chip capacitor bank. The capacitor bank includes a plurality of on-chip capacitors, each of which is independently selectable by a control signal for providing a selectable amount of capacitance to the oscillator to control the oscillator's oscillation frequency.

4 Claims, 5 Drawing Sheets

OTHER PUBLICATIONS

Levine "An Algorithm to Synchronize the Time of a computer to Universal Time" IEEE Transactions on Networking vol. 3, No. 1 Feb. 1995, pp. 42-50.*

Levine "Time Synchronization over the Internet using 'AutoLock'" 1998 IEEE International Frequency Control Symposium 1998 pp. 241-249.*

Levine "Time Synchronization over the Internet using an Adaptive Frequency-locked Loop" IEEE Transactions on Ultrasonics, Ferroelectrics and Frequency Control vol. 46, No. 4 Jul. 1999 pp. 888-896.*

Fasbender et al. "On Assessing Unidirectional Latencies in Aachet-switched Networks" IEEE 1997 pp. 490-494.*

Levine "Time Synchronization using the Internet" IEEE Transactions on Ultrasonics, Ferroelectrics and Frequency Control vol. 45, No. 2, Mar. 1998 pp. 450-460.*

Monington et al. "Time Synchronization Using the Internet" IEEE International Frequency Control Symposium, 1997 pp. 395-403.*

Mills Improved Algorithms for Synchronizing Computer Network Clocks IEEE Transactions on Networking vol. 3, No. 3 Jun. 3, 1995 pp. 245-254.*

Lombardi "Computer Time Synchronization" Time & Frequency Divison National Institute of Standards and Technology pp. 1-7 1999 http://tf.nist.gov/general/pubs.htm.*

"Set your Computer Clock via the Internet" NIST Internet Time Service Apr. 2003 pp. 1-4 http://www.boulder.nist.gov/timefreq/service/its.htm.*

"Evaluating the Accuracy of Maxim Real-Time Clocks (RTCs)" Dallas MAXIUM App Notes Aug. 1, 2001 pp. 1-7 http://www.maxium-ic.com/appnotes.cfm/appnote_number/632/In/en.*

Lin. "A 6.5GHz Momolithic CMOS Voltage-Controlled Oscillator." IEEE International Solid State Circuits Conference, Feb. 15-17, 1999, pp. 404-405.

"A.6: The MOS Capacitor" http://ece-www.colorado.edu/~bart/book/mosexact.pdf, pp. A6.1-A6.8 (accessed on Oct. 18, 2005).

* cited by examiner

OSCILLATOR WITH TUNABLE CAPACITOR

RELATED APPLICATIONS

This application is a divisional application and claims priority to U.S. application Ser. No. 10/054,358, filed Jan. 17, 2002, the contents of which are incorporated herein by reference.

TECHNICAL FIELD

This invention relates to oscillator circuits, and more particularly to tunable oscillator circuits.

BACKGROUND

Oscillator circuits can be used to provide timing signals. For example, a personal computer motherboard typically has a Real Time Clock (RTC) circuit that provides an accurate 32.768 KHz oscillating signal that is further processed to obtain the second, minute, and hour values used by the computer system to keep time.

The RTC circuit is typically part of an I/O controller hub chip (sometimes referred to as the south-bridge chipset), and is connected to an external crystal resonator that resonates within a narrow range of operating frequencies. Depending on the crystal oscillator topology, one or more discrete external load capacitors may be connected to the RTC circuit to tune the oscillating frequency. The values of the load capacitors are selected according to an initial circuit layout design so that the RTC circuit in conjunction with the external components will oscillate at a predetermined frequency.

However, variation between different motherboard designs may result in placement of the load capacitors at slightly different locations on the motherboard, resulting in the addition of a certain amount of parasitic capacitance associated with the wiring connections. Other factors, such as tolerances in circuit components and minute routing differences, will also affect the oscillating frequency. Because a small variance in the oscillating frequency may significantly affect the accuracy of the system time signal over time, individual tuning of the capacitance value tailored to a specific motherboard design is required to obtain accurate system timing signals.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

As will be described in more detail below, the invention is directed towards circuitry for controlling oscillating frequency of an oscillator. In addition to the external load capacitors, the circuitry includes on-chip capacitors, each of which is independently selectable by a control signal, and each of which provides a controllable amount of capacitance to the oscillator to control the oscillating frequency of the oscillator. The term "on-chip capacitor" means that the capacitor is manufactured on a semiconductor chip.

Figure 1:
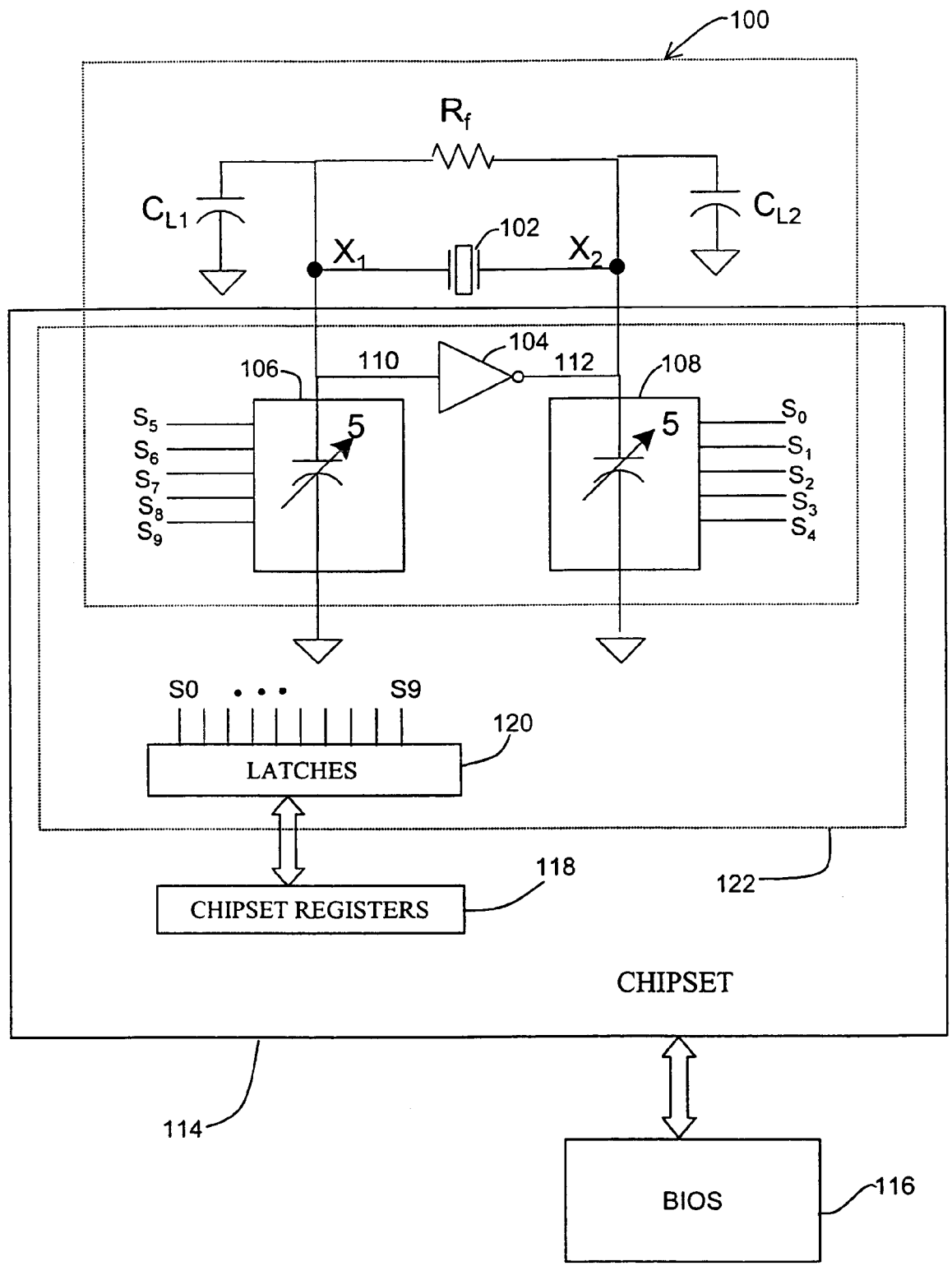
FIG. 1 is a schematic diagram of a computer chipset with external components that form a digitally tunable oscillator.

Referring to FIG. 1, a tunable clock oscillator circuit 100 (enclosed in dotted lines) includes two digitally selectable on-chip capacitor banks 106 and 108 connected to a terminal $X_1$ and a terminal $X_2$, respectively, of a crystal resonator 102. Terminals $X_1$ and $X_2$ are connected to an input terminal 110 and an output terminal 112, respectively, of an inverting amplifier 104. A feedback resistor $R_f$ is connected in parallel to resonator 102 to bias amplifier 104 into a linear mode. Capacitor banks 106 and 108 are used to fine-tune the oscillating frequency of oscillator circuit 100. By selecting different combinations of capacitors in the on-chip capacitor banks, a different amount of capacitance can be connected to resonator 102, thereby controlling the oscillating frequency of oscillator circuit 100.

Two external load capacitors $C_{L1}$ and $C_{L2}$ are connected to terminals $X_1$ and $X_2$, respectively. The capacitance values of load capacitors $C_{L1}$ and $C_{L2}$ are selected according to specifications given by the manufacturer of resonator 102. The impedance of load capacitors, combined with the crystal's calibrated impedance, tunes the circuit to operate in a particular frequency in the "parallel or series resonance" area (depending on oscillator topology). For example, resonator 102 resonates at approximately 32.77 KHz, capacitors $C_{L1}$ and $C_{L2}$ have capacitances of about 15 pF, and resistor $R_f$ has a value of about 10 MegOhms.

Capacitor banks 106 and 108 each include an array of capacitors that are individually selectable by a set of externally provided control signals to provide a variable amount of capacitance. For example, capacitor banks 106 and 108 each provide a selectable amount of capacitance in the range of 0 to 4 pF.

Amplifier 104 and capacitor banks 106, 108 are located within an RTC circuit 122 (enclosed in dotted lines), which is part of a chipset 114 of a computer system. RTC circuit 122 has a set of latches 120 that latches a set of control signals $S_0$ to $S_9$ that is generated by programmable registers 118 of chipset 114. Control signals $S_0$ to $S_9$ are used to select the individual capacitors in capacitor banks 106 and 108.

RTC circuit 122 is powered by a system power supply, as well as a separate battery supply when the computer system is turned off. When the battery supply is first connected to RTC circuit 122, default values are loaded into the latches to select a default set of capacitors. When the computer is initially booted up after RTC circuit 122 is connected to the battery supply, a predefined register setting is read from a BIOS memory 116 and passed through chipset registers 118 to latches 120. The latches store the register setting for the life of the battery, or until the setting is changed by chipset registers 118.

The load capacitors $C_{L1}$ and $C_{L2}$ are shown as being connected outside of chipset 114. However, it is understood that the load capacitors $C_{L1}$ and $C_{L2}$ may also be integrated within chipset 114. It is also possible to integrate the resonator, load capacitors, resistor, and the RTC circuitry within the same package.

Figure 2:
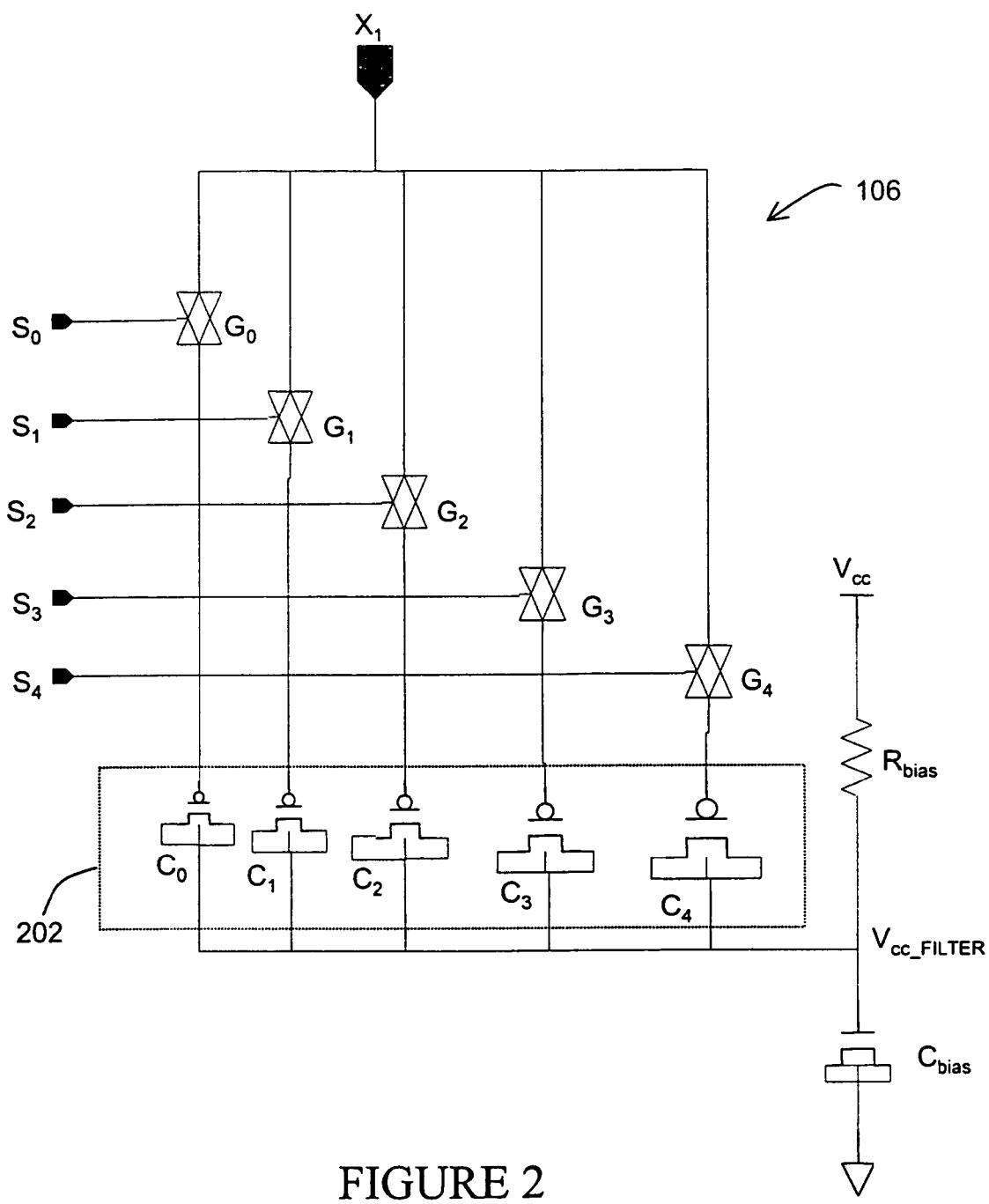
FIG. 2 is a schematic diagram of an on-chip capacitor bank of the oscillator circuit of FIG. 1.

Referring to FIG. 2, capacitor bank 106 has a capacitor array 202 that includes five capacitors, $C_0$ to $C_4$. Each capacitor is selectable by one of the control signals $S_0$ to $S_4$ through control gate switches $G_0$ to $G_4$. The capacitance values of the capacitors have a binary-weighted relationship, such that $C_4$ has twice the amount of capacitance as $C_3$, $C_3$ has twice the amount of capacitance of $C_2$, and so forth. For example, $C_4$=2 pF, $C_3$=1 pF, $C_2$=0.5 pF, $C_1$=0.25 pF, $C_0$=0.125 pF.

Chipset registers 118 provide control signals $S_0$ to $S_4$, which are latched by latches 120. A control signal selects a capacitor by turning on the corresponding control gate switch so that one terminal of the capacitor is connected to terminal 110 of crystal resonator 102. To obtain a certain value of capacitance, chipset registers 118 select a number of capacitors so that the sum of the capacitances of the selected capacitors most closely approximate the desired capacitance value. Capacitor bank 108 operates similarly to capacitor bank 106.

Figure 3:
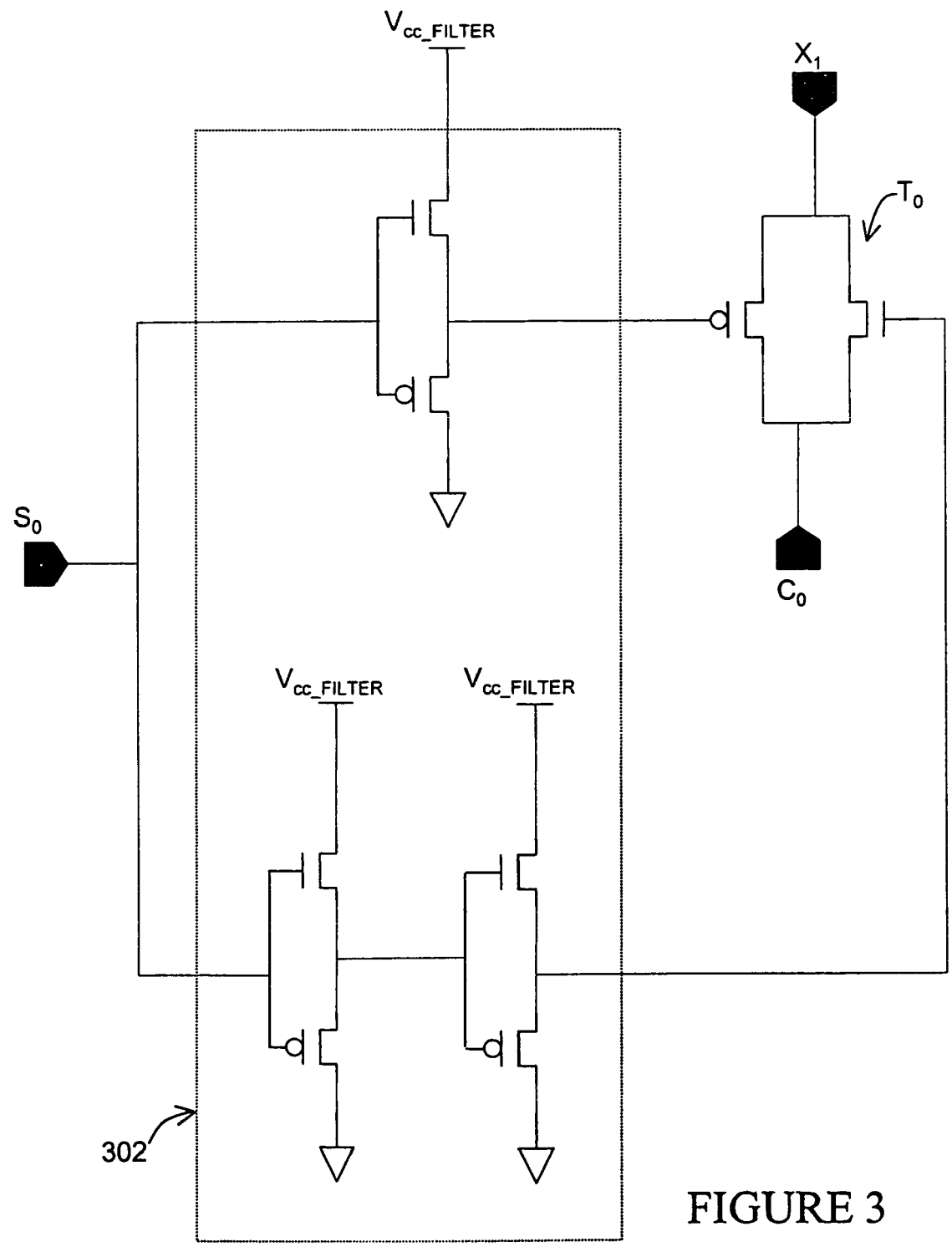
FIG. 3 is a schematic diagram of a buffer circuit connected to a transmission gate switch.

Capacitors $C_0$ to $C_4$ are enhancement mode P-type MOS-FETs (PMOS) with the drain nodes connected to the source nodes. The gate of the MOSFET functions as one terminal of the capacitor, and the drain/source node functions as the other terminal. A $V_{CC\_FILTER}$ signal is derived from the power supply signal $V_{cc}$ to bias the PMOS capacitors into saturation. Most of the high frequency noise contained in the $V_{cc}$ signal is filtered by a low pass filter composed of resistor $R_{bias}$ and capacitor $C_{bias}$. The $V_{CC\_FILTER}$ signal also provides a filtered power supply signal to a buffer circuit that drives transmission gate switches (FIG. 3). Use of the low pass filter also enables low power operation because capacitor $C_{bias}$ blocks direct current from flowing.

Referring to FIG. 3, a control gate switch $G_0$ includes a buffer circuit 302 and a transmission gate $T_0$. Buffer circuit 302 is used to decouple transmission gate switch $T_0$ from logic circuit that produces signal $S_0$. This is to prevent noise generated in the chipset logic circuit from reaching oscillator circuit 100 through transmission gate switch $T_0$. Buffer circuit 302 is powered by the $V_{CC\_FILTER}$ signal. Use of $V_{CC\_FILTER}$ signal is required to prevent unwanted noise in the RTC power supply signal from interfering with the operation of oscillator circuit 100. Additional buffer circuits (having the same configuration as buffer circuit 302) are provided to decouple transmission gate switches $T_1$ to $T_9$ from the logic circuits that produce signals $S_1$ to $S_9$.

Figure 4:
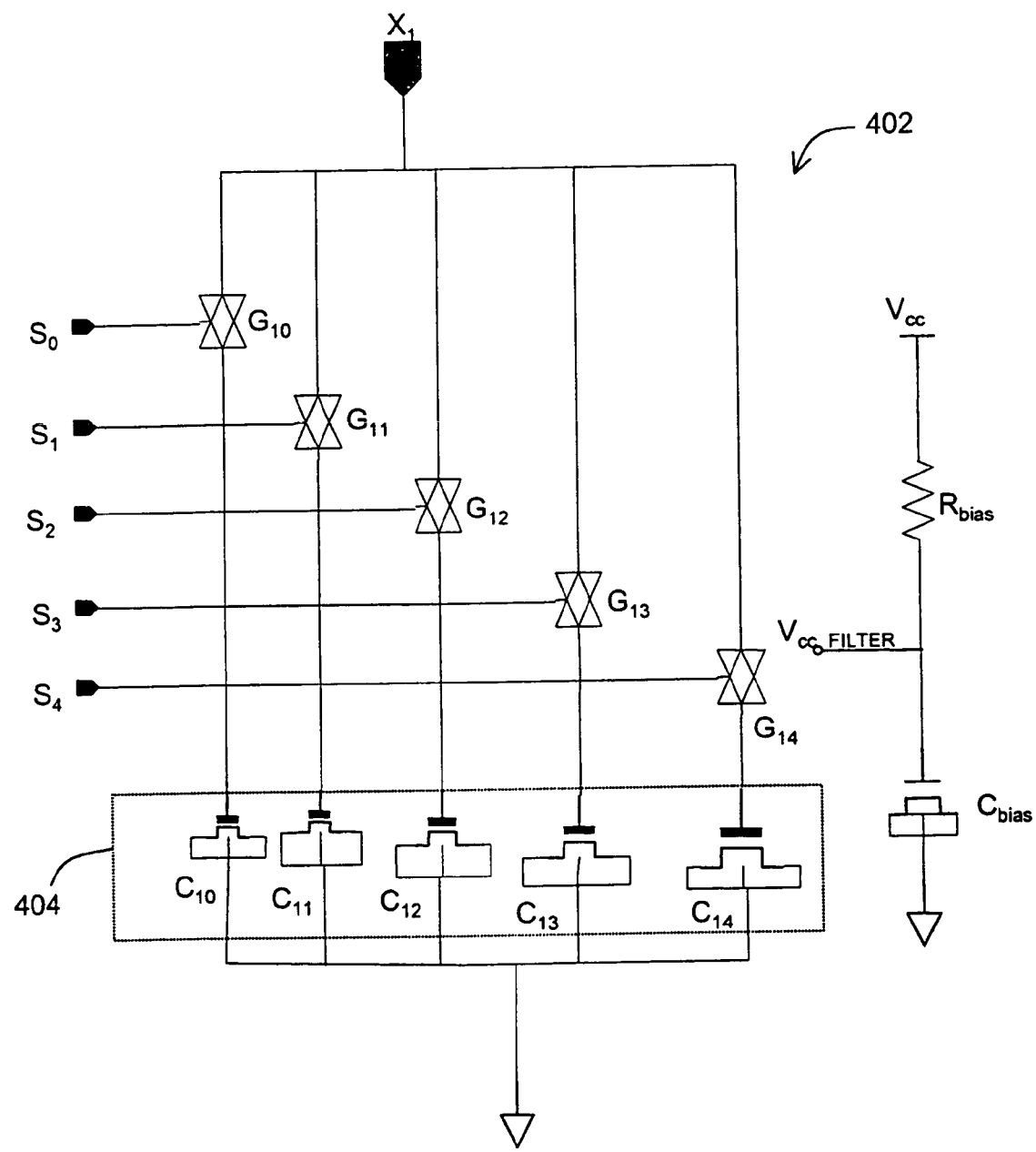
FIG. 4 is a schematic diagram of an alternative embodiment of an on-chip capacitor bank.

FIG. 4 shows an example of an on-chip capacitor bank constructed from "depletion mode" NMOS transistors. An on-chip capacitor bank 402 includes an on-chip capacitor array 404 and control gates $G_{10}$ to $G_{14}$. Capacitor array 404 includes depletion mode NMOS capacitors $C_{10}$ to $C_{14}$, each of which is made of an N-type MOSFET, with one terminal of the capacitor being the gate node of the MOSFET, and the other terminal of the capacitor being the source-drain connected node of the MOSFET.

When NMOS capacitors are used, it is not necessary to use $V_{CC\_FILTER}$ signal to bias the capacitors into saturation. This is because a depletion mode transistor has a negative threshold voltage, so a channel is formed for all non-negative oscillation voltage levels, and thus provides a greater capacitance. Because $V_{CC\_FILTER}$ is used only to power the logic gates of buffer circuit 302, smaller values for resistor $R_{bias}$ and capacitor $C_{bias}$ can be used. This allows for reduction of the size of the capacitor bank 402 because the "series effect" of the capacitor bank and the capacitor $C_{bias}$ is eliminated.

An advantage of using tunable capacitor banks 106, 108 is that the computer system can dynamically adjust the oscillating frequency of oscillator circuit 100 based on a reference time signal. The computer may log on to the Internet at regular time intervals, and compare the system time signal with a reference time signal, such as that provided by the NIST Internet Time Service. Based on the difference between the system time and reference time, chipset 114 may change the setting of registers 118 to select a different arrangement of capacitors in capacitor banks 106 and 108. By selecting a slightly higher or lower amount of capacitance to be connected to crystal resonator 102, chipset 114 can fine-tune the oscillating frequency of oscillator circuit 100. After each adjustment, the chipset register setting are latched by latches 120 so that oscillator circuit 100 can provide accurate time signals even after system is powered down or off.

Another advantage of using tunable capacitor banks in an oscillator circuit is that adjustment of the oscillation frequency can be performed after the hardware connections of the electronic components and circuit boards are fixed. Due to tolerances in the components and boards, the actual capacitance connected to the crystal resonator is often slightly different from the capacitance values in the original design. By adjusting the amount of capacitance provided by the tunable capacitor banks, oscillation frequency can be tuned without altering any hardware component or connection. The adjustment can be done manually or automatically through appropriate software.

Use of tunable capacitor banks is not limited to the RTC circuit of computer systems. All circuits that require tine-tuning of an accurate amount of capacitance may use a tunable capacitor bank. All electronic devices that require an accurate oscillating signal may use tunable capacitor banks to fine-tune the oscillation frequency. The fine-tuning of the oscillation frequency may be used to compensate changes in temperature and humidity, or to compensate manufacturing tolerances. Such tine-tuning of the oscillation frequency after hardware connections are fixed allows more flexibility in the selection of electronic components and circuit board layout designs.

Figure 5:
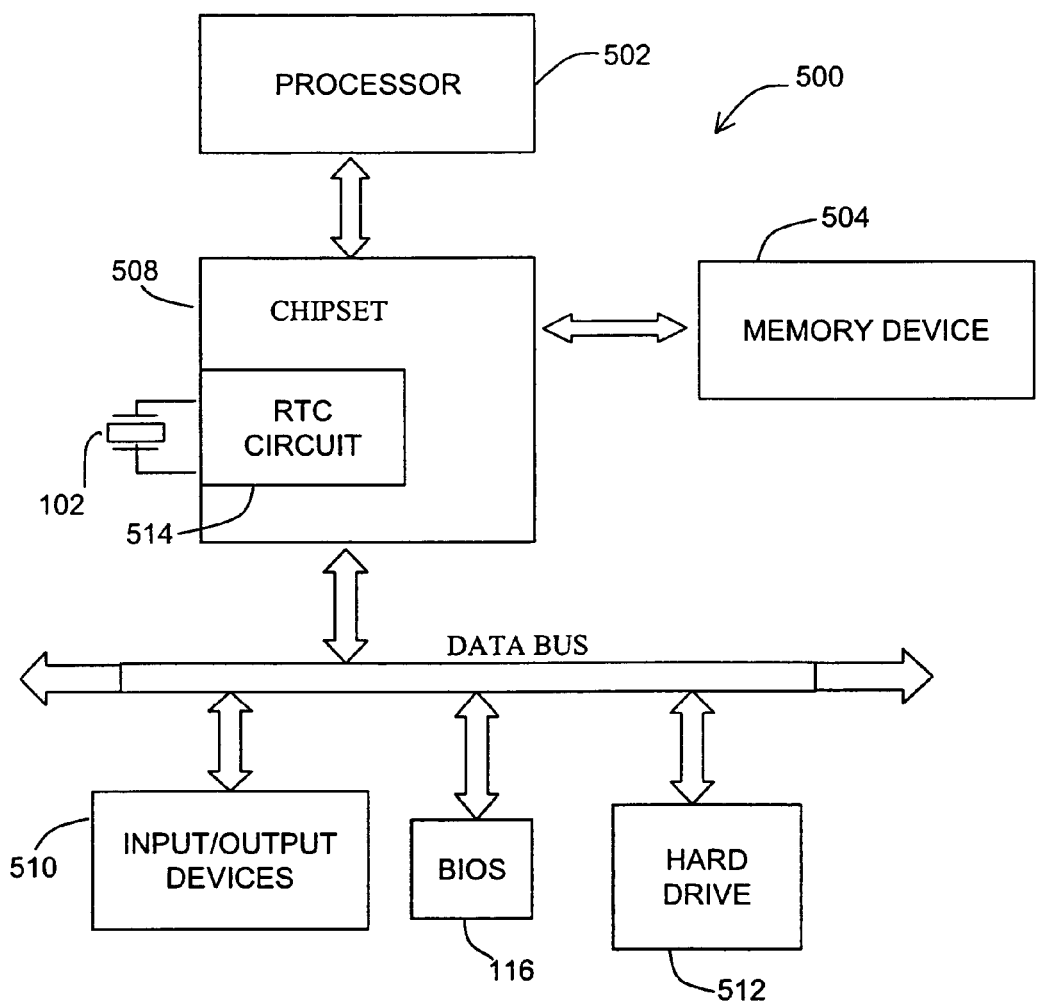
FIG. 5 is a block diagram of an electronic device.

Referring to FIG. 5, an electronic device 500 includes a chipset 508 that has a RTC circuit 514 that provides a stable clock signal. RTC circuit 514 includes two tunable on-chip capacitor banks connected to each of the two terminals of a resonator 102. The RTC circuit 514 is powered by both a main power supply and a battery supply so that it can keep the oscillation even when the main power supply is shut off.

Chipset 508 includes a set of latches that store a set of register bit values used to control the selection of on-chip capacitors in the capacitor banks. When chipset 508 is delivered to a manufacturer of device 500, the latches store default values. When the manufacturer designs a circuit board using the chipset 508, the manufacturer may decide to modify the values stored in the latches by writing new register bit values into a BIOS 116.

When the battery is first inserted to provide power to RTC circuit 514, the register bit values are read from BIOS 116 and passed to the latches. Chipset 508 includes a register that stores a "capacitor-set flag" which is used to track whether the register bit values need to be updated. Initially, the capacitor-set flag is set to "0". Every time electronic device 500 boots, the capacitor-set flag is checked. If the flag is set to "1", the latch values are not changed. If the flag equals "0", the register bit values stored in BIOS 116 are read and used to overwrite the values previously stored in the latches. The capacitor-set flag is then set to "1".

A user can overwrite the register bit values stored in BIOS 116. The user then sets the capacitor-set flag to "1" to prevent BIOS 116 from overwriting the user-defined settings when device 500 boots the next time. The latch settings may also be modified by an operating system (OS) running on device 500. For example, the OS may perform an adjustment to the clock signal. An accurate reference time signal is received from an input/output device 510. The OS controls chipset 508 to adjust the latch settings according to the reference time signal so that RTC circuit 514 provides an accurate time signal. The OS then sets the capacitor-set flag to "1" to prevent BIOS 116 from overwriting the latch settings. The register bit values defined by the user or operating system are maintained in the latches as long as the battery continues to provide power to the latches and the RTC circuit.

Device 500 further includes a processor 502 that processes data and a memory device 504 that stores data. The electronic device 500 may be a computer, a handheld device, a consumer electronics device, or any other device that requires an accurate time signal.

A number of embodiments of the invention have been described. Nevertheless, it will be understood that various modifications may be made without departing from the spirit and scope of the invention. For example, the capacitor bank may incorporate a greater number of capacitors to provide a greater range of capacitance selection. The capacitance values of the capacitors in the capacitor bank may have some relationship other than a binary-weighted relationship so as to provide different capacitance combinations. The capacitors in the capacitor bank may be on-chip poly-capacitors or on-chip metal capacitors. The capacitors in the capacitor bank may even include discrete capacitors that are not made on a semiconductor chip. The external capacitors $C_{L1}$ and $C_{L2}$ may be connected in series to resonator 102 such that resonator 102 operate in a series resonance mode. For the capacitor bank of FIG. 2, a series connection with resistor $R_{bias}$ and capacitor $C_{bias}$ is not required if the oscillator signals remain above the threshold voltage of the capacitors in the capacitor bank. Device 500 may save the latch settings in a file in a hard drive 512. The file is loaded each time after device 500 is booted and used to set the chipset registers to select appropriate capacitors in the capacitor banks. This prevents the loss of latch settings in the event that the battery power is lost. Accordingly, other embodiments are within the scope of the following claims.

What is claimed is:

1. A method of generating a time signal comprising:
   initializing a set of control signals in which initializing the set of control signals comprises initializing the set of control signals based on values stored in a basic input/output system (BIOS);
   generating a system time signal using a real time clock circuit that has a tunable oscillator for adjusting an operation frequency of the real time clock circuit, the tunable oscillator having a set of capacitors that can be independently selected based on the set of control signals;
   receiving a reference time signal over a network; and
   after the initializing, adjusting the set of control signals to modify a selection of a subset of the capacitors in the tunable oscillator to increase or decrease the operating frequency of the real time clock circuit in response to a difference between the system time signal and the reference time signal; and
   setting a flag to indicate whether, after rebooting of an electronic device that includes the real time clock, the set of control signals need to be initialized.

2. The method of claim 1, in which the capacitors comprise drain-source connected P-type MOSFET capacitors.

3. The method of claim 2, further comprising using a low pass filter to generate a bias voltage to bias the drains and sources of the P-type MOSFET capacitors.

4. The method of claim 1, further comprising, after rebooting the electronic device and initializing the set of control signals, setting the flag to indicate that the control signals do not need to be initialized the next time the electronic device is rebooted.

* * * * *